US006978425B1

(12) United States Patent
Raghunathan et al.

(10) Patent No.: US 6,978,425 B1
(45) Date of Patent: Dec. 20, 2005

(54) METHODOLOGY FOR THE DESIGN OF HIGH-PERFORMANCE COMMUNICATION ARCHITECTURES FOR SYSTEM-ON-CHIPS USING COMMUNICATION ARCHITECTURE TUNERS

(75) Inventors: Anand Raghunathan, Plainsboro, NJ (US); Ganesh Lakshminarayana, Plainsboro, NJ (US); Kanishka Lahiri, La Jolla, CA (US); Sujit Dey, San Diego, CA (US)

(73) Assignees: NEC Corporation, Tokyo (JP); The Regents of the University of California, Oakland, CA (US)

( * ) Notice: Subject to any disclaimer, the term of this patent is extended or adjusted under 35 U.S.C. 154(b) by 0 days.

(21) Appl. No.: 09/576,956

(22) Filed: May 24, 2000

Related U.S. Application Data

(60) Provisional application No. 60/186,751, filed on Mar. 3, 2000.

(51) Int. Cl.[7] .................. G06F 17/50; G06F 9/455
(52) U.S. Cl. ................ 716/1; 716/2; 716/3; 716/4; 716/5; 716/6; 716/7; 703/23; 703/27
(58) Field of Search ............ 716/1, 2–7, 18; 320/257, 345, 410; 709/107, 249, 253, 310; 326/38, 39; 710/104; 703/23, 27

(56) References Cited

U.S. PATENT DOCUMENTS

| 6,086,628 | A | * | 7/2000 | Dave et al. ............ 716/7 |
| 6,097,886 | A | * | 8/2000 | Dave et al. ............ 703/23 |
| 6,110,220 | A | * | 8/2000 | Dave et al. ............ 716/3 |
| 6,112,023 | A | * | 8/2000 | Dave et al. ............ 703/27 |
| 6,178,542 | B1 | * | 1/2001 | Dave ................... 716/18 |
| 6,289,488 | B1 | * | 9/2001 | Dave et al. ............ 716/1 |

OTHER PUBLICATIONS

Lahiri et al., Fast performance of bus-based system-on-chip communication architectures, Nov. 1999, Computer-aided design 1999, Digest of Technical Papers, IEEE/ACM International Conference, pp.: 566-572.*
Xia et al., "Verification of a combinational loop based arbitration scheme in a system-on-chip integration architecture", Hanuary 2000, VLSI design, 2000, Thirteenth international cinference, pp.: 449-454.*
Lahiri et al., "Performance analysis of systems with multi-channel communication architectures", Jan. 2000, VLSI design, Thirteeth International Conference, pp.: 530-537.*
Fornaciari et al., "Power estimation for architectural exploration of HW/SW communicatiuon on system-level busses", May 1999, Hardware/siftware codesign, (CODES'99) Proceedings of the seventh international workshop, pp.: 152-156.*
Lagnese et al., "Architectural partitioning for system level synthesis of integrated circuits", Jul. 1991, Computer-Aided Design of Integrated Circuits and Systems, IEEE Transactions on□□vol. 10, Issue 7, Page(s):847-860.*

(Continued)

*Primary Examiner*—A. M. Thompson
*Assistant Examiner*—Helen Rossoshek
(74) *Attorney, Agent, or Firm*—Sughrue Mion, PLLC

(57) ABSTRACT

A method of designing a communication architecture comprising receiving a partitioned system, communication architecture topology, input traces and performance matrices. Analyzing and creating communication analysis graph (CAG). Partitioning communication instances to create partition clusters. Evaluating cluster statistics related to the partition clusters and assigning parameter values to the partition clusters to form a new system with new communication architecture. Reanalyzing the new system and recomputing performance metrics. If performance is improved then synthesizing CATs to realize optimized protocols. If performance is not improved then the process is repeated.

8 Claims, 17 Drawing Sheets

OTHER PUBLICATIONS

Yen et al., "Sensitivity-driven co-synthesis of distributed embedded systems", Sep. 13-15, 1995, System Synthesis, 1995., Proceedings of the Eighth International Symposium on, Page(s):4-9.*

* cited by examiner

METHODOLOGY FOR THE DESIGN OF HIGH-PERFORMANCE COMMUNICATION ARCHITECTURES FOR SYSTEM-ON-CHIPS USING COMMUNICATION ARCHITECTURE TUNERS

I. DESCRIPTION OF THE INVENTION

This Application claims priority from U.S. Provisional patent application Ser. No. 60/186,751 filed on Mar. 3, 2000 now abandoned.

I.A. Field of the Invention

This disclosure teaches a methodology for the design of custom system-on-chips communication architecture. Specifically a novel electronic system and a method of designing a communication architecture are disclosed. This Application is currently filed with U.S. patent application Ser. No. 09/576,955 by Raghunathan et al.

I.B. Background of the Invention

The evolution of the System-on-Chip (SOC) paradigm in electronic system design has the potential to offer the designer several benefits, including improvements in system cost, size, performance, power dissipation, and design turn-around-time. The ability to realize this potential depends on how well the designer exploits the customizability offered by the system-on-chip approach. While one dimension of this customizability is manifested in the diversity and configurability of the components that are used to compose the system (e.g., processor and domain-specific cores, peripherals, etc.), another, equally important, aspect is the customizability of the system communication architecture. In order to support the increasing diversity and volume of on-chip communication requirements, while meeting stringent performance constraints and power budgets, communication architectures need to be customized to the target system or application domain in which they are used.

I.B.1. Related Work

Related work in the fields of system-level design, HW/SW co-design, and networking protocols, have been examined herein to place the disclosed techniques in the context of conventional technologies. A substantial body of work exists in relation to system-level synthesis of application-specific architectures through HW/SW partitioning and mapping of the application tasks onto pre-designed cores and application-specific hardware. For more details, see D. D. Gajski, F Vahid, S. Narayan and J. Gong, *Specification and Design of Embedded Systems*. Prentice Hall, 1994; G. De Micheli, *Synthesis and Optimization Digital Circuits*. McGraw-Hill, New York, N.Y., 1994; R. Ernst, J. Henkel, and T. Benner, "Hardware-software cosynthesis for microcontrollers," *IEEE Design &Test Magazine*, pp. 64–75, December 1993; T. B. Ismail, M. Abid, and M. Jerraya, "COSMOS:A codesign approach for a communicating system," in Proc. IEEE International Workshop on Software/Codesign, pp. 17–24, 1994; A. Kalavade and E. Lee, "A globally critical/locally phase driven algorithm for the constrained hardware software partitioning problem in Proc. *IEEE International Workshop on Hardware/Sotware Codesign*, pp. 42–48, 1994; P. H. Chou, R. B. Ortega, and G. B. Borriello, "The CHINOOK hardware/software cosynthesis system," in *Proc. Int. Symp. System Level Synthesis*, pp. 22–27, 1995; B. Lin, "A system design methodology for software/hardware codevelopment of telecommunication network applications," in *Proc. Design Automation Conf*, pp. 672–677, 1996; B. P. Dave, G. Lakshminarayana, and N. K. Jha, "COSYN: hardware-software cosynthesis of embedded systems," in *Proc. Design Automation Conf*, pp. 703–708, 1997 and P. Knudsen and J. Madsen, "Integrating communication protocol selection with partitioning in hardware/software codesign," in *Proc. Int. Symp. System Level Synthesis*, pp. 111–116, December 1998.

While some of these conventional techniques attempt to consider the impact of communication effects during HW/SW partitioning and mapping, they either assume a fixed communication protocol (e.g., PCI-based buses), or select from a "communication library" of a few alternative protocols. Research on system-level synthesis of communication architectures mostly deals with synthesis of the communication architecture topology, which refers to the manner in which components are structurally connected through dedicated links or shared communication channels (buses). For more details on these architectures, see T. Yen and W. Wolf, "Communication synthesis for distributed embedded systems," in *Proc. Int. Conf. Computer-Aided Design*, pp. 288–294, November 1995; J. Daveau, T. B. Ismail, and A. A. Jerraya, "Synthesis of system-level communication by an allocation based approach," in *Proc. Int. Symp. System Level Synthesis*, pp. 150–155, September 1995; M. Gasteier and M. Glesner, "Bus-based communication synthesis on system level," in *ACM Trans. Design Automation Electronic Systems*, pp. 1–11, Jan. 1999 and R. B. Ortega and G. Borriello, "Communication synthesis for distributed embedded systems," in *Proc. Int. Conf. Computer-Aided Design*, pp. 437–444, 1998.

While topology selection is a critical step in communication architecture design, equally important is the design of the protocols used by the channels/buses in the selected topology. For example, the nature of communication traffic generated by the system components may favor the use of a time-slice based bus protocol in some cases, and a static priority based protocol in others. For more details, see "Sonics Integration Architecture, Sonics Inc. (http://www-.sonicsinc.com/)." and *On-Chip Bus Development Working Group Specification I Version* 1.1.0. VSI Alliance, August 1998. The VSI Alliance on-chip bus working group has recognized that a multitude of bus protocols will be needed to serve the wide range of SOC communication requirements. See *On-Chip Bus Development Working Group Specification I Version* 1.1.0. VSI Alliance, August 1998. Further, most protocols offer the designer avenues for customization in the form of parameters such as arbitration priorities, transfer block sizes, etc. Choosing appropriate values for these parameters can significantly impact the latency and transfer bandwidth associated with inter-component communication.

Finally, there is a body of work on interface synthesis, which deals with automatically generating efficient hardware implementations for component-to-bus or component-to-component interfaces. For more details, see G. Borriello and R. H. Katz, "Synthesis and optimization of interface transducer logic," in *Proc. Int. Conf Computer Design*, November 1987; J. S. Sun and R. W. Brodersen, "Design of system interface modules," in *Proc. Int. Conf. Computer-Aided Design*, pp. 478–481, November 1992; P. Gutberlet and W. Rosenstiel, "Specification of interface components for synchronous data paths," in *Proc. Int. Symp. System Level Synthesis*, pp. 134–139, 1994; S. Narayanan and D. D. Gajski, "Interfacing incompatible protocols using interface process generation," in *Proc. Design Automation Conf.*, pp. 468–473, June 1995; P. Chou, R. B. Ortega, and O. Borriello, "Interface co-synthesis techniques for embedded systems," in *Proc. Int. Conf. Computer-Aided Design*, pp. 280–287, November 1995; J. Oberg, A. Kumar, and A. Hemani, "Grammar-based hardware synthesis of data communication protocols," in *Proc. Int. Symp. System Level Synthesis*, pp. 14–19, 1996; R. Passerone, J. A. Rowson, and A. Sangiovanni-Vincentelli, "Automatic synthesis of interfaces between incompatible protocols," in *Proc. Design Automation Conf.*, pp. 8–13, June 1998 and J. Smith and G. De Micheli, "Automated composition of hardware components," in *Proc. Design Automation Conf.*, pp. 14–19, June 1998. These techniques address issues in the implementation of specified protocols, and not in the customization of the protocols themselves.

In summary, conventional technologies in the field of system-level design and HW/SW co-design do not adequately address the problem of customizing the protocols used in SOC communication architectures to the needs of the application. Further, in previous research, design of the communication architecture is performed statically using information about the application and its environment (e.g., typical input traces). However, in several applications, the communication bandwidth required by each component, the amount of data it needs to communicate, and the relative "importance" of each communication request, may be subject to significant dynamic variations. In such situations, protocols used in conventional communication architectures may not be capable of adapting the underlying communication topology to meeting the application's varying needs.

In the field of telecommunications and networking protocol design, a significant body of research has been devoted to the design of protocols to meet diverse quality of service (QoS) parameters such as connection establishment delay and failure probability, throughput, residual error ratio, etc. For details on these parameters, see A. S. Tanenbaum, *Computer Networks*. Englewood Cliffs, N.J, Prentice Hall, 1989. Sophisticated conventional techniques such as flow and traffic control algorithms have been proposed in that context for adapting the protocol to improve the above-mentioned metrics.

With increasing complexity, system-on-chip communication architectures will need to evolve by drawing upon some of the techniques that have been developed in the context of telecom networks. However, there are significant differences such as, but not limited to, the latency requirements, error tolerance and resilience requirements, which differentiate the problem that is addressed herein and the problems encountered in telecom network protocol design.

I.B.2. Communication Architecture Tuners: Introduction and Design Issues

In this section, the need for CAT-based communication architectures is demonstrated by showing how the limited flexibility of conventional communication architectures, and their inability to adapt to the varying communication needs of the system components, can lead to significant deterioration in the system's performance.

EXAMPLE 1

Consider the example system shown in FIG. 1 that represents part of the TCP/IP communications protocol used in a network interface card (hereinafter this system is referred to as the TCP system). The system shown in FIG. 1 performs checksum-based encoding (for outgoing packets) and error detection (for incoming packets), and interfaces with the Ethernet controller peripheral (which implements the physical and link layer network protocols). Since packets in the TCP protocol do not contain any notion of quality of service (QoS), the packet data structure has been enhanced to contain a field in the header that indicates a deadline for the packet to be processed. The objective during the implementation of the system is to minimize the number of packets with missed deadlines.

FIG. 1(*a*) shows the behavior of the TCP system as a set of concurrent communicating tasks or processes. The tasks performed by the TCP system for a packet received by the system from the network are explained herein. The process ether_driver, which represents the Ethernet device driver, reads data from the Ethernet controller peripheral and creates a packet in the shared system memory. Process pkt_queue maintains a queue containing selected information from the packet headers. Process ip_check dequeues packet information from the above-mentioned queue, zeroes out some specific fields in the packet header, and co-ordinates the checksum computation. Process checksum retrieves the packet from the shared memory and computes the checksum value for each packet and returns the value to the ip_check process, which flags an error when appropriate.

FIG. 1(*b*) shows the system architecture used to implement the TCP system. The ether_driver and pkt_queue processes are mapped to embedded software running on a MIPS R3000 processor, while the ip_check and checksum processes are implemented using dedicated hardware. All communications between the system components are implemented using a shared bus. The protocol used in the shared bus supports static priority based arbitration and DMA-mode transfer. Herein, the term DMA mode transfer is used to refer to the transmission of data in clusters or chunks larger than a single bus word. In static priority based arbitration, each component connected to the bus is assigned a fixed priority. At any time, the arbiter grants the use of the bus to the requesting component with highest priority value. The granularity of these chunks is governed by the value of the DMA size parameter assigned to each component.

The bus arbiter and the bus interfaces of the components together implement the bus protocol. The bus protocol allows the system designer to specify values for various parameters such as the bus priorities and DMA block size for each component, etc.

The performance of the TCP system of FIG. 1 for several distinct values of the bus protocol parameters are analyzed. For this experiment, for ease of explanation, only the bus priority values for each component, with fixed values for the remaining protocol parameters. The system simulation was performed using traces of packets with varying laxities of deadlines. An abstract view of the execution of the TCP system processing four packets (numbered i, i+1, j, j+1) is shown in FIG. 2. The figure indicates the times at which each packet arrives from the network, and the deadline by which it needs to be processed. Note that while the arrival times of the packets are in the order i, i+1, j, j+1, the deadlines are in a different order i+1, i, j, j+1. For the sake of the present illustration, two different bus priority assignments have been focused on (checksum>ip_check>ether_driver and ether_driver>ip_check> checksum). While other priority assignments are not explicitly considered here, it should be clear to a skilled artisan that the arguments presented for one of the above two cases will hold for every other priority assignment.

The first waveform in FIG. 2 represents the execution of the system when the bus priority assignment checksum>ip_check>ether_driver is used. After the completion of the ether_driver process for packet i, the arbiter receives two conflicting bus access requests: process ip_check requests bus access to process packet i, while ether_driver requests bus access to process packet i+1

(since packet i+1 has already arrived from the network). Based on the priority assignment used, the arbiter gives bus access to process ip_check. This effectively delays the processing of packet i+1 until ip_check and checksum have completed processing packet i. This leads to packet i+1 missing its deadline. Packets j and j+1 do meet their deadlines, as shown in FIG. 2. In general, for any sequence of packets whose deadlines are not in the same order as their arrival times, the priority assignment (checksum>ip_check>ether_driver) may lead to missed deadlines.

It is attempted to eliminate the problem mentioned above by using a different priority assignment (ether_driver>ip_check>checksum) for the bus protocol. The execution of the system under the new priority assignment is depicted in the second waveform of FIG. 2. As a result of the new priority assignment, when packet i+1 arrives, process ether_driver is able to process it without waiting for packet i to complete. This results in the deadlines for both packets i and i+1 being met. However, consider packets j and j+1 whose deadlines are in the same order as their arrival times. After process ether_driver completes processing packet j, contention for the shared bus occurs between process ether_driver for packet j+1, and process ip_check for packet j. Based on the chosen priority assignment, the arbiter decides in favor of process ether_driver. This delays the execution of process ip_check and checksum for packet j, leading to the system missing packet j's deadline.

In summary, each of the two bus priority assignments considered for the TCP system led to missed deadlines. Further, the arguments presented in the previous two paragraphs can be applied to show that for every possible priority assignment, either packet i+1 or packet j will miss its deadline.

The deficiency of the communication architecture that leads to missed deadlines in the TCP example can be summarized as follows. The relative importance of the communication transactions generated by the various system components (ether_driver, ip_check, and checksum) varies depending on the deadlines of the packets they are processing. In general, the importance or criticality of each communication transaction may depend on several factors which together determine whether the communication will be on the system's critical path. The communication architecture needs to be able to discern between more critical and less critical communication requests and serve them accordingly.

As shown in the TCP example, conventional communication architectures suffer from the at least the following drawbacks: (i) the degree of customizability offered may be insufficient in systems with stringent performance requirements, and (ii) they are typically not capable of sensing and adapting to the varying communication needs of the system and the varying nature of the data being communicated.

II. SUMMARY OF THE DISCLOSED TECHNIQUES

In this disclosure, a general methodology for the design of custom system-on-chip communication architectures, which are flexible and capable of adapting to varying communication needs of the system components is presented. The disclosed technique can be used to optimize any underlying communication architecture topology by rendering it capable of adapting to the changing communication needs of the components connected to it. For example, more critical data may be handled differently, leading to lower communication latencies. This results in significant improvements in various quality of service (QoS) metrics, including the overall system performance, observed communication bandwidth and bus utilization, and the system's ability to meet critical deadlines.

The present technique is based on the addition of a layer of circuitry, called the Communication Architecture Tuner (CAT), to each component. The CAT monitors and analyzes the internal state of, and communication transactions generated by, a system component and "predicts" the relative importance of communication transactions in terms of their impact on different system-level performance metrics. The results of the analysis are used by the CAT to configure the parameters of the underlying communication architecture to best suit the component's changing communication needs.

To meet the objects of the invention there is provided a method of designing a communication architecture comprising receiving a partitioned system, communication architecture topology, input traces and performance matrices; analyzing and creating communication analysis graph (CAG); partitioning communication instances to create partition clusters; evaluating cluster statistics related to the partition clusters and assigning parameter values to the partition clusters to form a new system with new communication architecture; reanalyzing the new system and recomputing performance metrics; if performance is improved then synthesizing CATs to realize optimized protocols; and if performance is not improved then repeating the steps;
  Preferably the partitioning further comprises analyzing the CAG to measure impact of individual communication instance delays on system performance; measuring performance impact of an instance using sensitivity; and grouping instances having a similar impact on system performance into a same partition.

Still preferably the sensitivity of the system performance to a communication instance is measured by perturbing an existing delay of the communication instance by a value; traversing a transition fanout of the communication instance in the CAG; recomputing a start and finish time of affected vertices; and
calculating changes in the system performance using recomputed finish times.

Preferably evaluating cluster statistics is accomplished by deriving a metric that penalizes a partition having a negative impact on delays of communication events in other partitions.

Still preferably the metric is calculated as follows: analyzing the CAG and evaluating for each partition pair $CP_i$ $CP_j$ an amount of time for which communication events that belong to $CP_i$ are delayed due to events from $CP_j$ to form delay statistics; and combining the delay statistics into a formula that produces an optimum parameter assignment.

Still preferably the parameter assignment is done using heuristics.

Still preferably the parameter is priority.

Still preferably the parameter is DMA block size.

Still preferably the parameter assignment takes into account hardware complexity of implementing the parameter.

III. BRIEF DESCRIPTION OF THE DRAWINGS

The above objectives and advantages of the present invention will become more apparent by describing in detail preferred embodiments thereof with reference to the attached drawings in which:

FIG. 1 (b) shows an example TCP system implementation using a conventional bus-based communication architecture.

FIG. 3 (a)–(b) show a CAT-based communication architecture for the TCP example.

Figure 4:
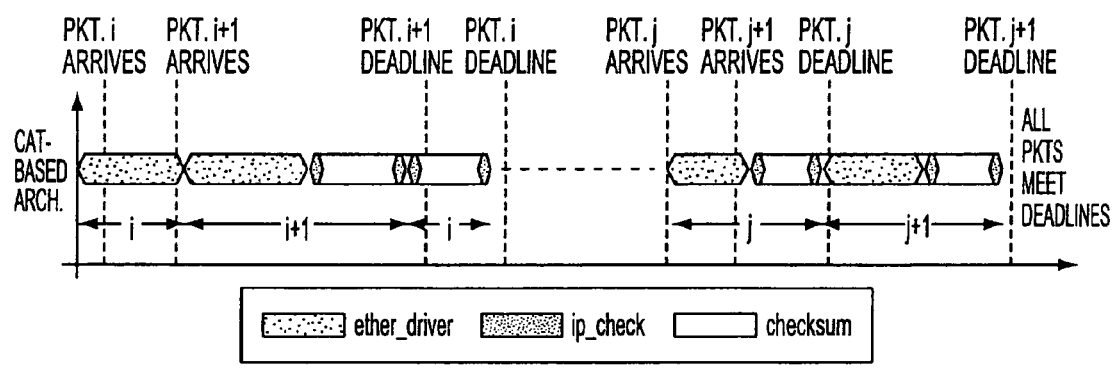

FIG. 4 shows the execution of the CAT-based architecture for the TCP system.

Figure 5:
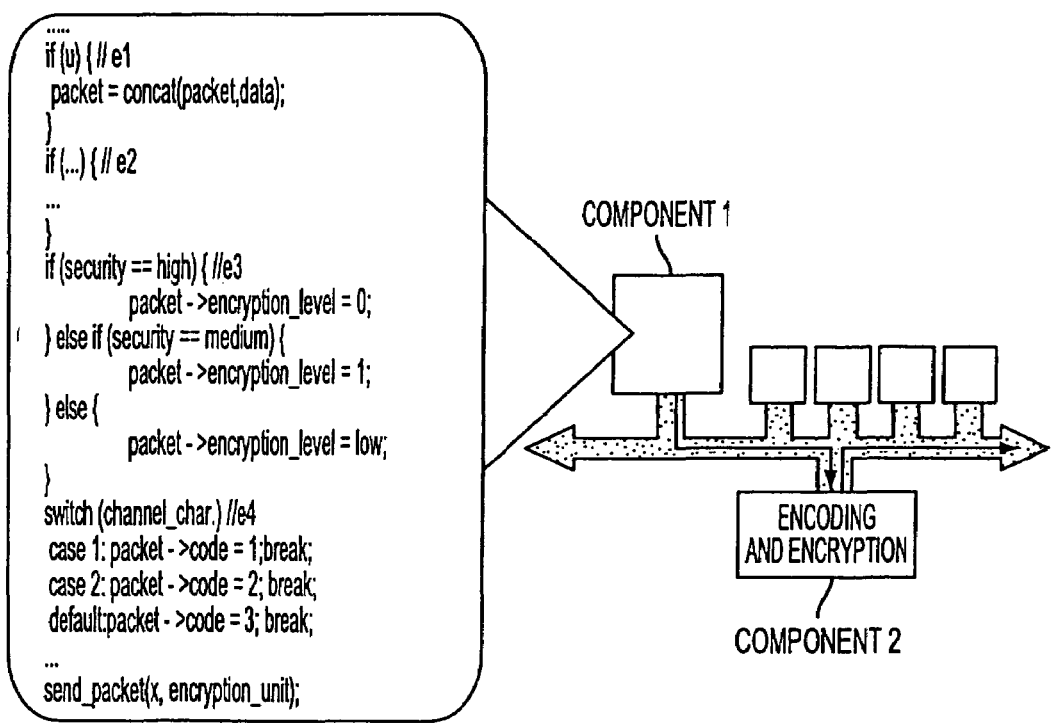

FIG. 5 shows a data encryption system that illustrates tradeoffs in the identification of critical communication events.

Figure 6:
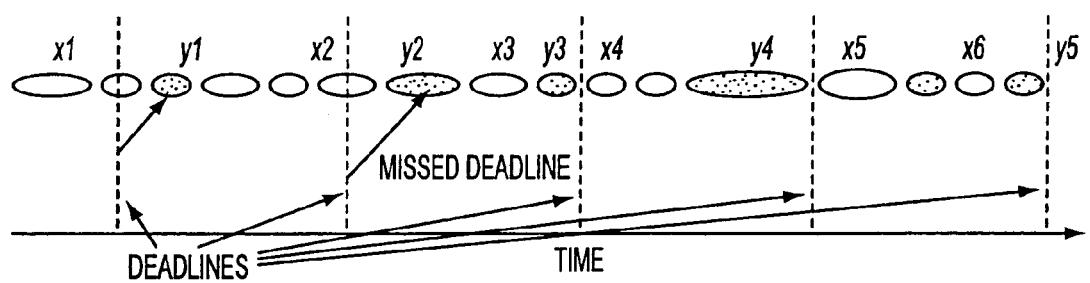

FIG. 6 shows a trace activity for the system shown in FIG. 5.

Figure 7A:
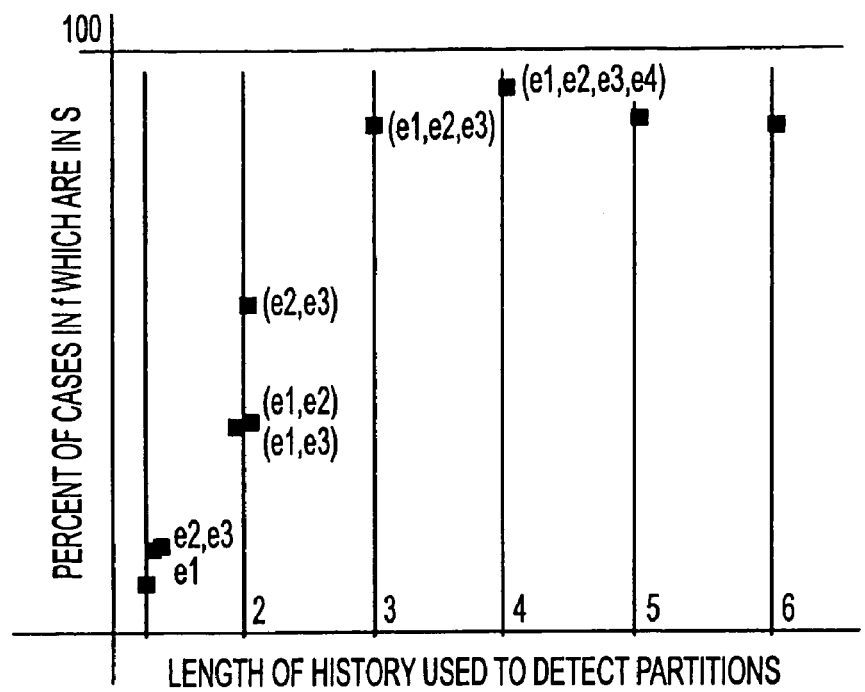
Figure 7B:
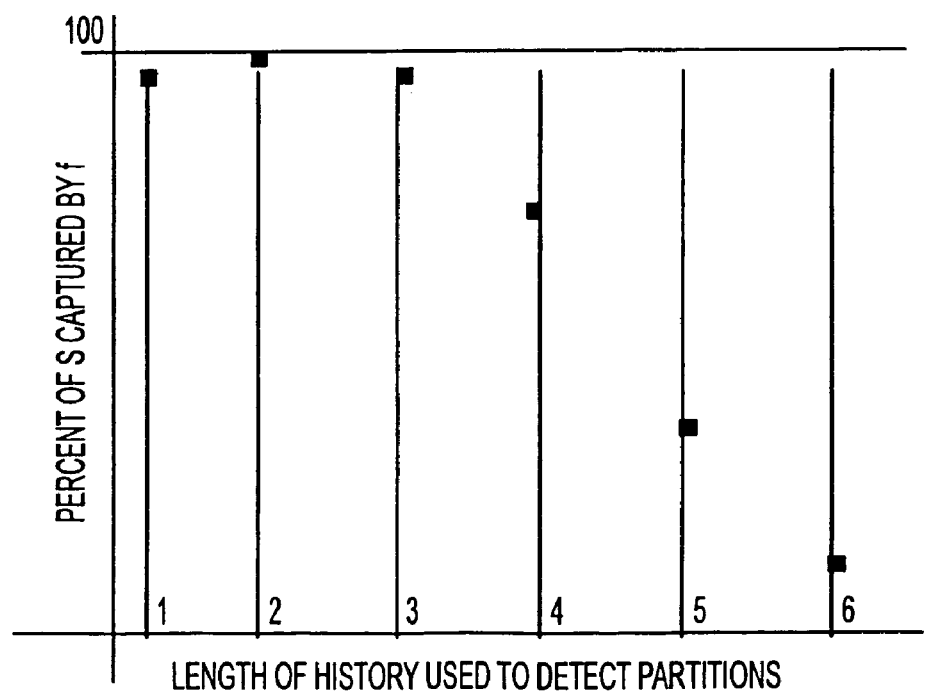

FIG. 7(a)–(b) show a plot of different classification metrics with respect to the number of variables used for the classification.

FIG. 8 (a) shows an example system with a CAT-based communication architecture.

FIG. 8 (b) shows a detailed view of a components in FIG. 8 (a) using a CAT.

Figure 9:
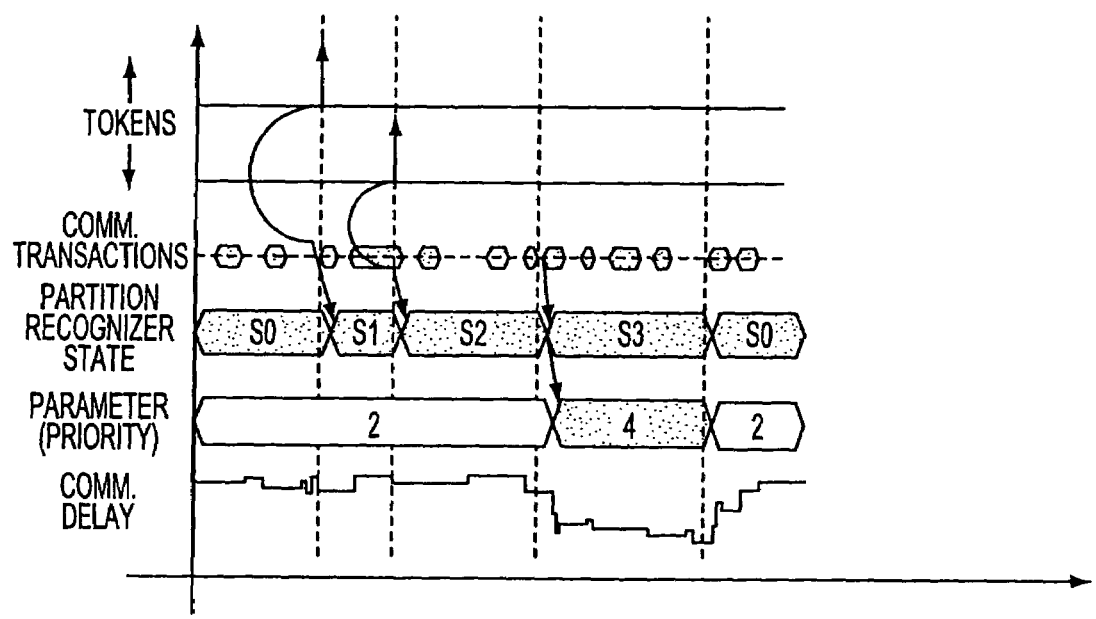

FIG. 9 shows a symbolic illustration of a CAT-optimizad communication architecture execution.

Figure 10:
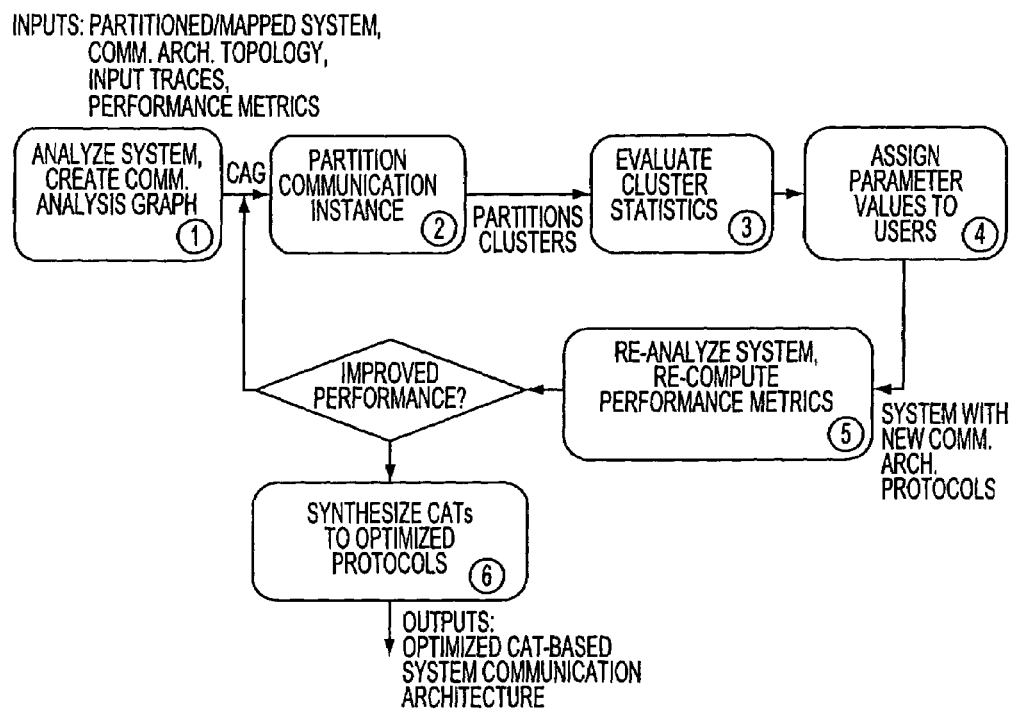

FIG. 10 shows an implementation of the procedure for designing a CAT-based communication architecture.

Figure 11:
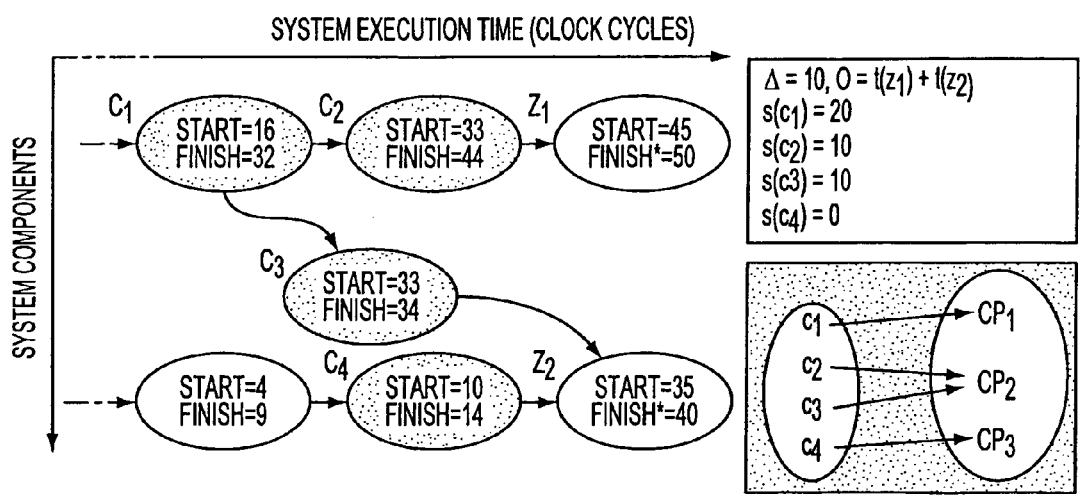

FIG. 11 shows sensitivity calculation and partitioning instances in the CAG.

Figure 12:
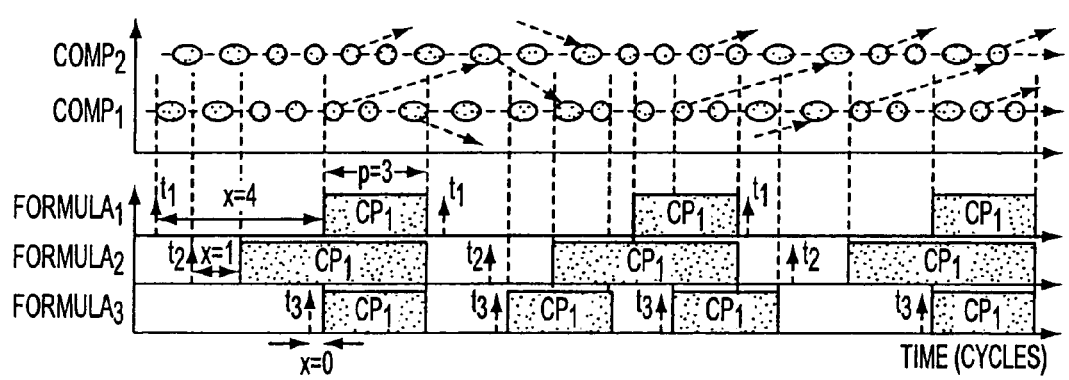

FIG. 12 shows alternate predictor strategies.

Figure 13:
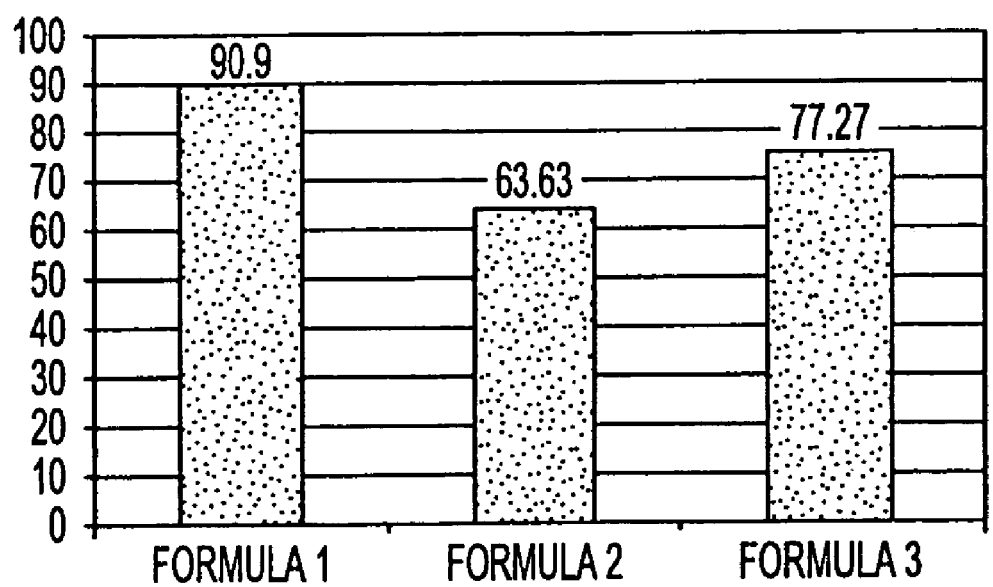

FIG. 13 shows the performance of predictors.

Figure 14:
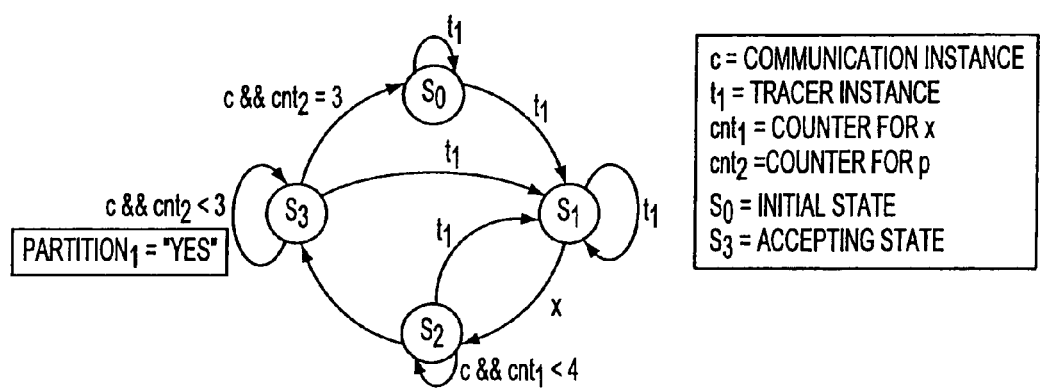

FIG. 14 shows an FSM implementation of Formula$_1$.

Figure 15:
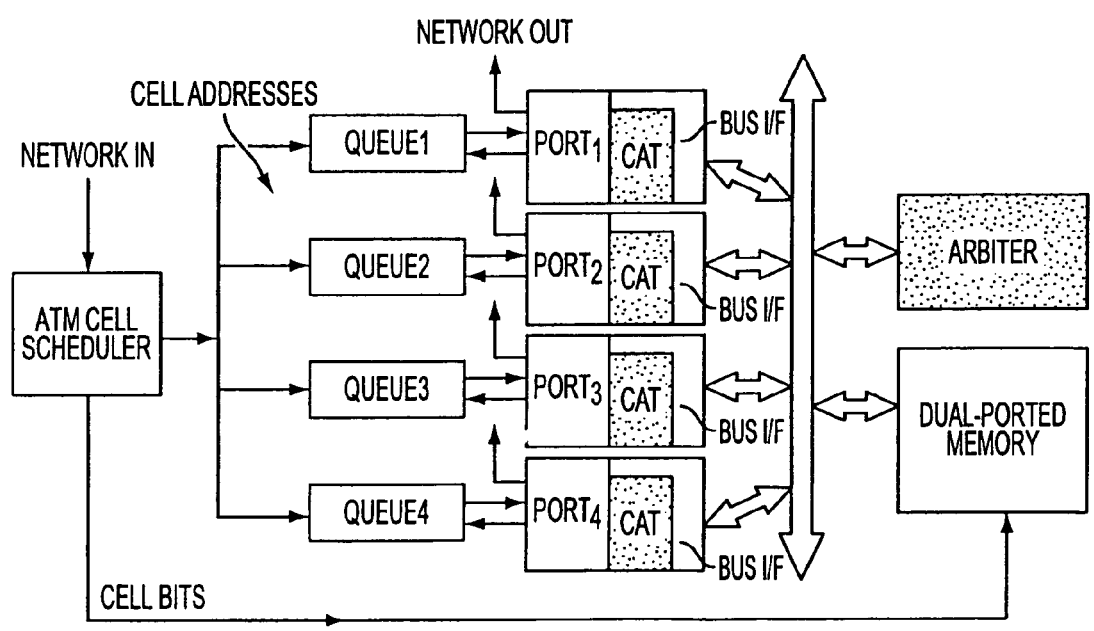

FIG. 15 shows an output queued ATM switch.

Figure 16:
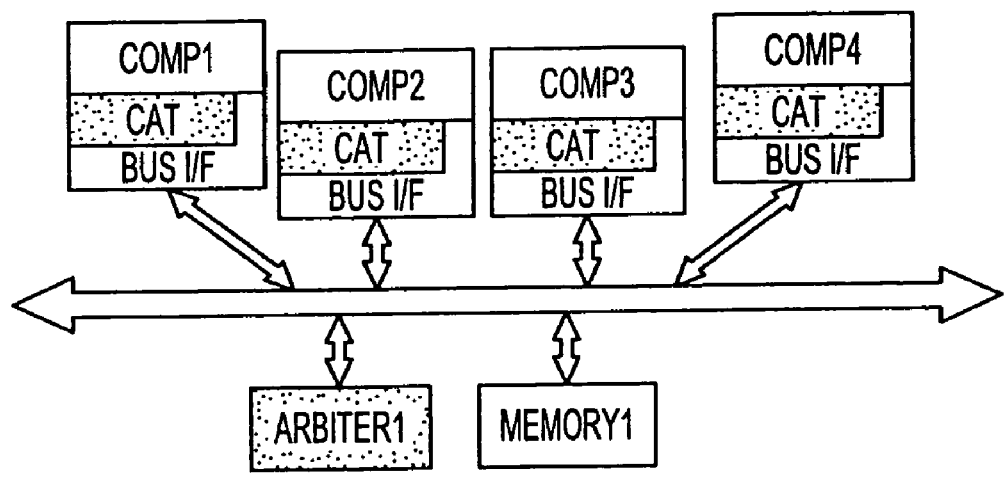

FIG. 16 shows an example system SYS with concurrent bus access.

Figure 17:
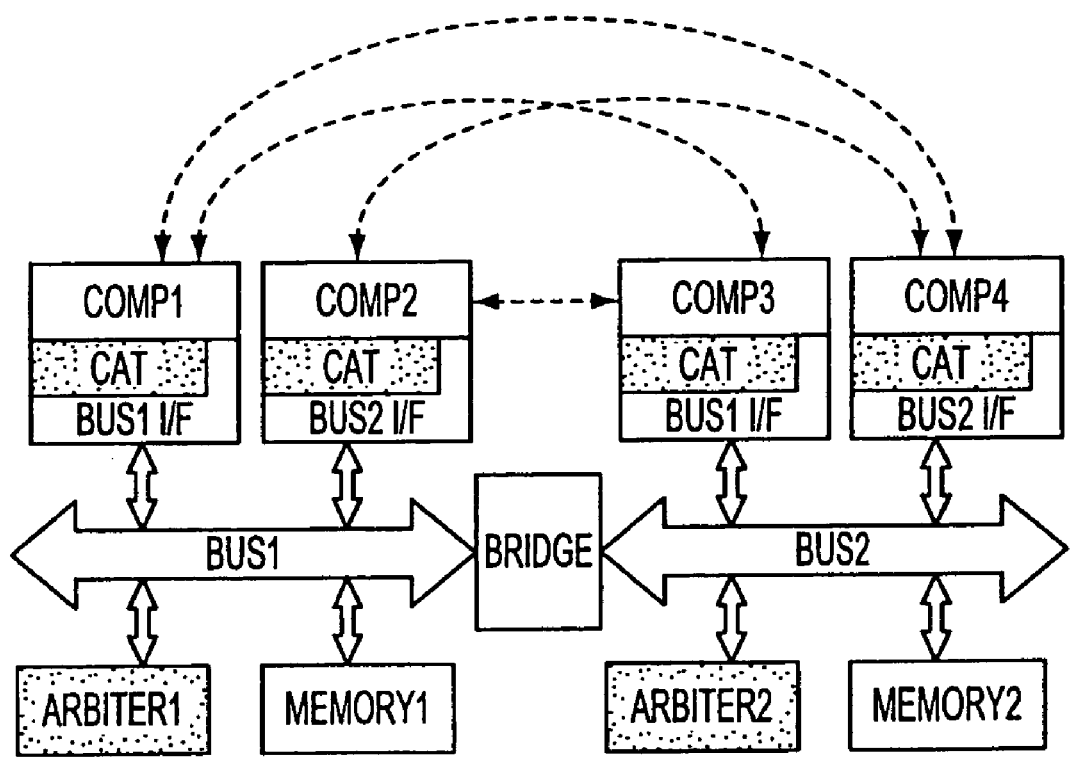

FIG. 17 shows example system BRDG with multiple buses.

IV. DETAILED DESCRIPTION OF THE DISCLOSED TECHNIQUES

IV.A. Roadmap of the Description

The need for CAT-based communication architectures is presented by analyzing example systems and scenarios in which no static customization of the protocols can completely satisfy the system's time-varying communication requirements. The issues and tradeoffs involved in the design of CAT-based communication architectures is illustrated. It is then demonstrated that the hardware implementation complexity of the CAT needs to be considered in order to maximally exploit the potential for performance improvements. A general methodology and algorithms for the design of CAT-based SOC communication architectures is then presented. Given a system with a defined communication architecture topology, typical input traces, and target performance metrics, the disclosed techniques are used to determine optimized communication protocols for the various channels/buses in the system. Then an efficient hardware implementation in the form of CATs which are connected in between each component and the communication architecture are disclosed. The techniques are further illustrated with experimental results for several example systems, including an ATM switch port scheduler and a TCP/IP Network Interface Card subsystem. The test results are shown to indicate that performance metrics (e.g., number of missed deadlines, average or aggregate processing time, etc.) for systems with CAT-based communication architectures are significantly (sometimes over an order of magnitude) better than systems with well-optimized conventional communication architectures.

In summary:

CAT-based communication architectures can extend the power of any underlying communication architecture. The timing behavior presented by a CAT-based communication architecture to each component connected to it (such as communication latency and bandwidth) is better customized to, and varies according to, the component's needs. This results in significantly improved system performance.

The presented CAT design methodology trades off sophistication of the communication architecture protocols with the complexity (and hence, overhead incurred by) the added hardware.

In several cases, the use of CAT-based communication architectures can result in systems that significantly outperform those based on any static customization of the protocol parameters.

IV.B. CAT-based Communication Architectures

In this sub-section, CAT-based communication architectures are shown and how such architecture address the above-mentioned drawbacks is illustrated. Then, key issues and tradeoffs involved in a CAT-based communication architecture design methodology are discussed.

CAT-based communication architectures address the problems discussed in the background section through the use of a hardware layer that adapts the underlying communication architecture according to the changing needs of the various components connected to it. Using the example discussed in the Background section, it is shown how a CAT-based communication architecture can be used to improve the performance.

EXAMPLE 2

Figure 3A:
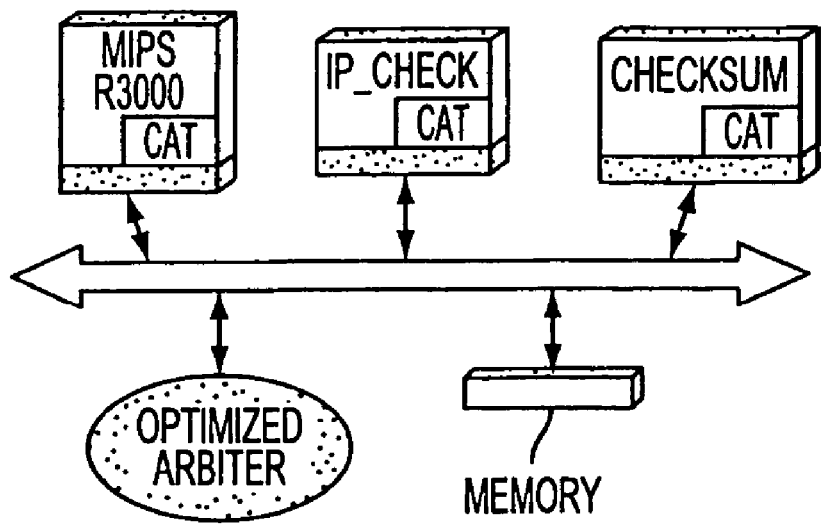
Figure 3B:
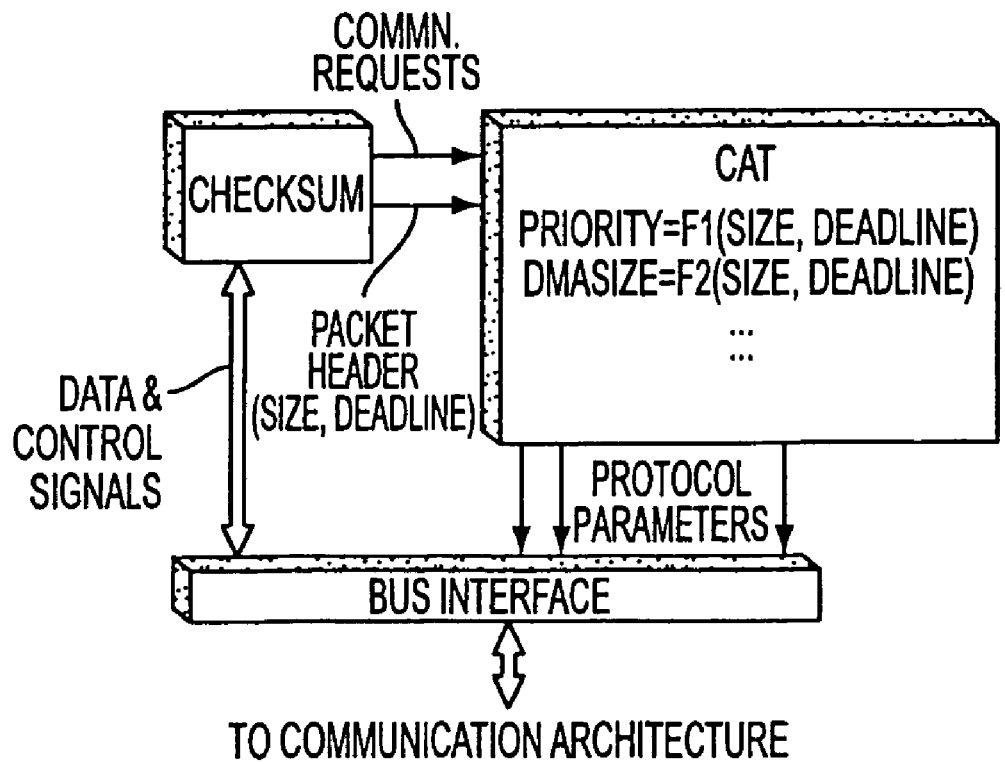

A CAT-based communication architecture for the TCP system discussed in the relation to Example.1 is shown in FIG. 3(a). It ahouls be noted that this example is merely illustrative and not meant to restrict the scope of the claims. CATs are added to the components that implement the ether_driver, ip_check, and checksum processes. Further, the bus control logic (arbiter and component bus interfaces) is enhanced to facilitate the operation of the CATs. A more detailed view of a component with a CAT is shown in FIG. 3(b). The component notifies the CAT when it generates communication requests. The CAT also observes selected details about the data being communicated and the component's internal state.

In this example, the CAT observes the packet size and deadline fields from the header of the packet currently being processed by the component. The CAT performs the following functions: (i) it groups communication events based on the size and deadline of the packet currently being processed, and (ii) for events from each group, it determines an appropriate assignment of values to the various protocol parameters. As a result, the characteristics of the communication architecture (including the time required to perform a communication) are adapted according to the different needs and relative importance of the communication requests. The rationale behind using the deadline is that packets with closer deadlines need to be given higher importance. The rationale behind using the size of the packet is more complex. In cases when all the packets in the system have roughly equal deadlines, it is advantageous to favor the completion of packets which are smaller, since they have a better chance of meeting the deadline.

Figure 1:
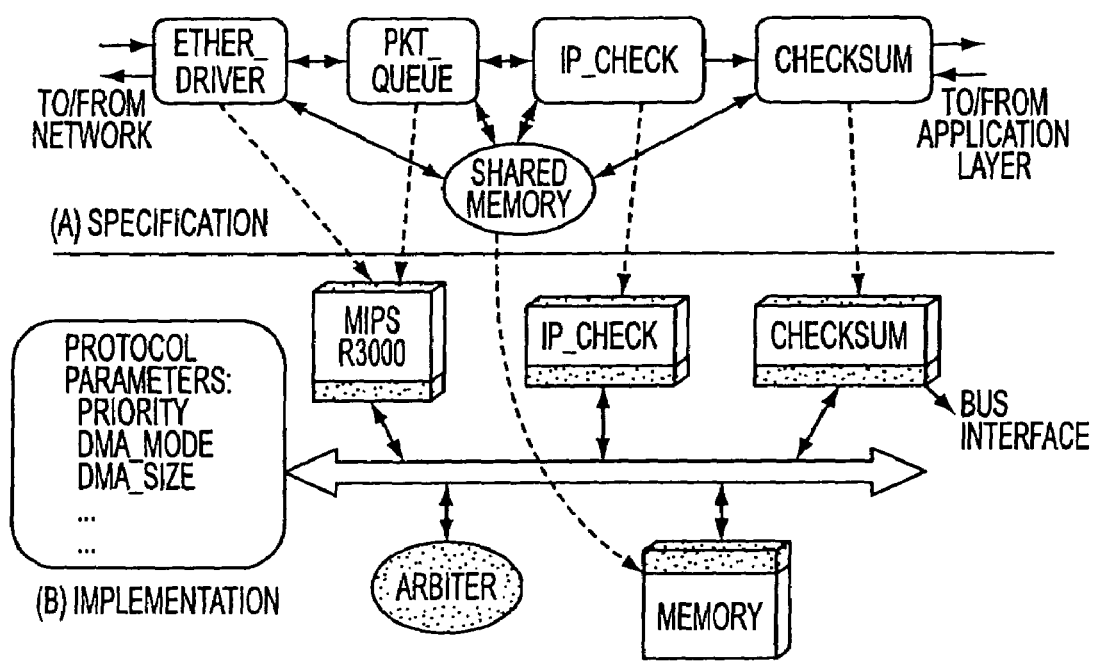
FIG. 1 (a) shows an example TCP system specification using a conventional bus-based communication architecture.

The techniques presented later in this disclosure is used to implement the CAT-based TOP system architecture shown in FIG. 3. For the ease of illustration, the CATs were used to vary only the bus priorities. All other parameters were specified to the same values that as used in the architecture of FIG. 1. The CAT groups the communication requests generated from a component based on the packet they belong to, and the priority of all communication requests associated with a packet are computed using the formula $s*(t_d-t_a)$ where s, $t_d$ and $t_a$ represent the packet size, deadline, and arrival time, respectively.

Figure 2:
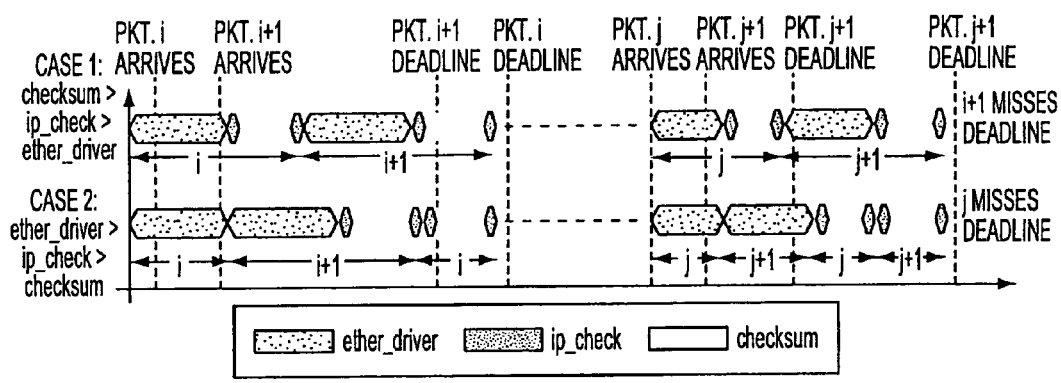
FIG. 2 shows an execution of the TCP system for various bus priority assignments.

The execution of the optimized system is shown in FIG. 4. The same packet sequence that was used to illustrate the inadequacy of the conventional communication architecture in FIG. 2 was used for this architecture development. The system meets the deadlines for all the packets (recall that the original system architecture presented in FIG. 1 missed deadlines for all priority assignments). When packet i+1 (which has a tight deadline) arrives, the CAT assigns to the communication requests generated by ether_driver a priority higher than those assigned to requests from ip_check and checksum, which are still processing packet i. This leads to packet i+1 meeting its deadline. When packet j+1 arrives, however, the communication requests generated by ether_driver are assigned a lower priority, allowing ip_check and checksum to process packet j to completion in order to meet its tight deadline.

From the conventional Example 1 and the inventive Example. 2 the need for Communication architecture tuners is clear. Such tuners detect the changing communication needs of the components they are connected to, and enable the system to effectively re-deploy its communication resources, when needed. An effective realization of a CAT-based communication architecture hinges on judiciously performing the following steps:

Identifying performance-critical communication events from a performance analysis of the system.

Detecting the occurrence of these communication events in hardware while the system is executing.

Assigning appropriate values for communication protocol parameters (such as priorities and DMA sizes) to the critical events, and translating these results into a high-performance implementation.

While several techniques have been proposed for system-level performance analysis and can be used for the first step, the present disclosure uses an analysis of the system execution traces as a basis for identifying critical communication events. For more background details on system execution traces, see D. D. Gajski, F Vahid, S. Narayan and J. Gong, *Specification and Design of Embedded Systems*. Prentice Hall, 1994 and G. De Micheli, *Synthesis and Optimization Digital Circuits*. McGraw-Hill, New York, N.Y., 1994. A significant advantage of using execution traces generated through system simulation, is that they can be derived for any system for which a system-level simulation model exists. The generated traces can be analyzed to examine the impact of individual (or groups of) communication events on the system's performance. Communication events which are on the system "critical paths", and whose delays significantly impact the specified performance metrics can be classified as critical. The details of the technique that is used to identify critical communication events are provided in Section IV.C.

Since the system execution trace is specific to the input traces or stimuli used, there is no simple way to correlate the critical communication events in the simulation trace to critical communication events that occur while the system executes (possibly under different stimuli). For example, consider a communication trace where the twentieth, twenty-first, and twenty-second data transfers after the start of system execution are shown to have a strong impact on system performance. Speeding up these data transfers would significantly improve system performance for the given input trace. Suppose that these insights need to be translated into an improved communication protocol. Clearly, a naive system, where the twentieth, twenty-first, and twenty-second data transfers have a high-priority, might not realize any performance gains, because the sequence of events that occurs during the system's execution could differ significantly from that of the trace. In addition to identifying critical communication events, their occurrence need to be correlated to other easily detectable properties of the system state and data it is processing.

For example, if an analysis of the simulation trace reveals that the occurrence of a critical data-transfer is highly correlated to a specific branch being encountered in the behavior of the component executing the transfer, the occurrence of the branch might be used as a predictor for the criticality of the data transfers generated by the component. The following example examines some tradeoffs in designing these predictors.

EXAMPLE 3

Consider the system shown in FIG. 5, which is used to encrypt data for security before transmission onto a communications network. Component1 processes the data, determines the coding and encryption scheme to be used, and sends the data to Component2, which encodes and encrypts the data before sending it through the shared bus to the peripheral that transmits it onto the network. FIG. 6 shows the data transfers occurring on the system bus. The shaded ellipses, marked $y_i$ (i=1 . . . n), represent data transfers from Component2 to the network peripheral. Suppose Component2 should transfer data at a fixed rate, and each data transfer should occur before a deadline (indicated in FIG. 6 by a dotted line). A key performance metric for the system is the number of data transfers completed by Component2 in a timely manner. The communication trace indicates that deadlines are frequently not met. Analysis of the system execution trace also identifies communication events that did not meet their deadlines, e.g., y1 and y2. In addition, it also identifies critical communication events, i.e., those which, when sped up, could potentially improve system performance. Since yi can occur only after xi, speeding up xi is one of the ways of improving system performance. Let S denote the set of all xi's such that yi does not meet the deadline. The performance of the system can improve if the communication times of the events in S improve.

Having isolated the critical communication events from the simulation trace, schemes need to be developed to identify these elements during the execution of the system. As mentioned before, this is done by correlating the occurrence of critical communication events with information about the system state and data it is processing. In this example, suppose critical communication events are correlated with the control-flow history of the component that generated them. A control-flow event is defined as a Boolean variable which assumes a value of 1 when a component executes a specific operation. For example, the behavior of Component1 shown in FIG. 5 is annotated with control-flow events e1, e2, e3, and e4. In general, if $e_1, e_2, \ldots ,$ en are the control-flow events which are used to determine whether or not a communication request is critical, a Boolean function $f_{critical}=f(e_1, e_2, \ldots, e_n)$ is defined whose on-set denotes the set of communication events classified as critical.

The number of control-flow variables used for this classification has a profound impact on the classification of communication events. A good classification should have the properties of a one-to-one map, i.e. every event classified as critical should indeed be critical, and every critical event should be detected by the classification. Suppose, in this example, if only one variable can be used for classification. Assume e3 is chosen as a classifier. In all the cases where deadlines are missed, event e3 occurs. Based on this insight, $f_{critical}$=e3 may be chosen. However, e3 often occurs along with non-critical communication events as well. If e3 is used as a classifier, only 160% of the communication events classified to be critical are indeed critical. Therefore, e3 could misclassify several communication events, and incorrectly increase their priorities, causing system performance to suffer.

FIGS. 7 (a) and (b) plot the percentage of critical communication events in $f_{critical}$ and the percentage of S covered by $f_{critical}$ versus the number of variables that perform the classification, respectively. The x axis shows the number of variables used to perform the classification. For example, the best classifier that uses two variables captures 100% of critical communication events, while only 500% of the communication events classified as "critical" by it are actually critical. Note that, in this example, as the number of variables increases, the percentage of critical communication events in $f_{critical}$ increases. This is because, as the number of variables increases, the classification criterion becomes more stringent, and non-critical events are less likely to pass the test. However, simultaneously, critical events could be missed, as shown in FIG. 7(b) (note the decrease in the percentage of S covered as the number of variables used increases). Therefore, one needs to judiciously choose the right number of variables, and the right classification functions in order to maximally improve system performance. In this example, optimal results are obtained by using three variables (e1, e2, and e3) and a classification function $f_{critical}=e1.\overline{e2}.e3$. This identifies most of the critical events, and very few non-critical ones.

IV.C. Methodology and Algorithms for the Design of Communication Architecture Tuners In this section, a structured methodology and automation algorithms for the design of CAT-based communication architectures is presented. Section IV.C.1 explains the overall methodology and outlines the different steps involved. Section IV.C.2 presents the algorithms used to perform the critical steps in more detail.

IV.C.1. Algorithm and Methodology: Overview

In this section, the techniques are described in the context of a design flow where the system is first partitioned and mapped onto various pre-designed cores and application-specific logic. Based on the communication and connectivity requirements of the system, a communication architecture topology is selected. The selected topology can then be optimized using the proposed techniques. The present algorithm takes as inputs a simulateable partitioned/mapped system description, the selected communication architecture topology, typical environment stimulus or input traces, and objectives and/or constraints on performance metrics. The performance metrics could be specified in terms of the amount of time taken to complete a specific amount of work (e.g., a weighted or uniform average of processing times) or in terms of the number of output deadlines met or missed for applications with real-time constraints. The output of the algorithm is a set of optimized communication protocols for the target system. From a hardware point-of-view, the system is enhanced through the addition of Communication Architecture Tuners wherever necessary, and through the modification of the controllers/arbiters for the various channels in the communication architecture.

Figure 8A:
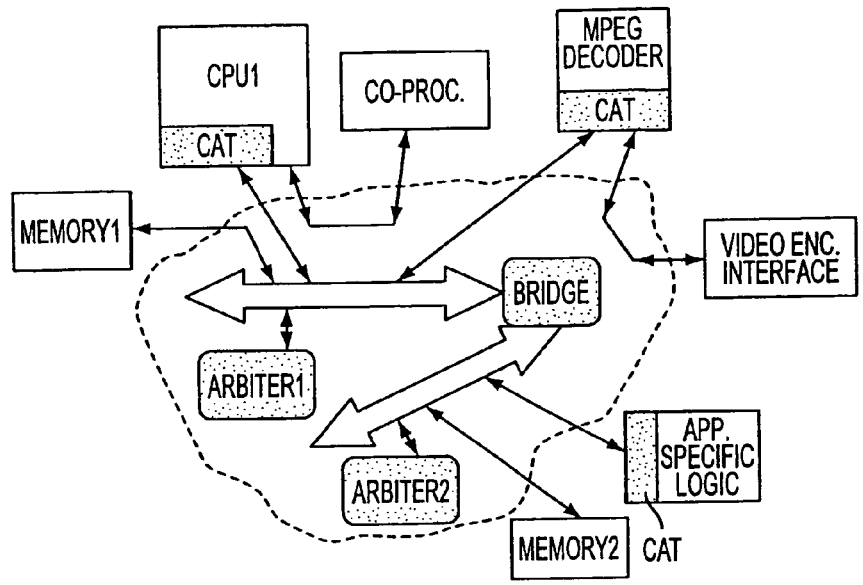

A typical system with a CAT-based communication architecture generated using our techniques is shown in FIG. 8(a). The system contains several components, including a processor core, memories, and peripherals. The selected communication architecture topology is enclosed in the dotted boundary. The topology selected consists of dedicated channels between components (e.g., between the processor and co-processor), as well as two shared buses that are connected by a bridge. The portions of the system that are added or modified as a result of the disclosed technique are shown shaded in FIG. 8(a). The present technique can be applied to general communication architecture topologies that can be expressed as an arbitrary interconnected network of dedicated and shared channels.

Figure 8B:
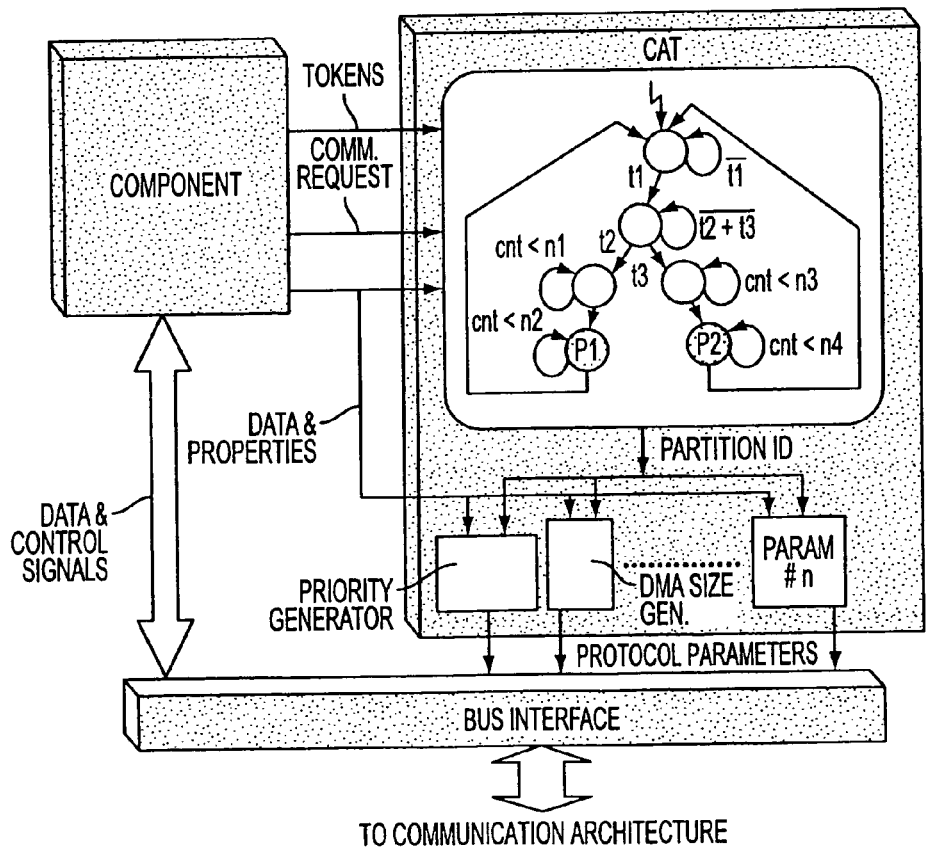

A more detailed view of a component with a CAT is shown in FIG. 8(b). The CAT consists of a "partition detector" circuit, which is shown as a finite-state automaton in the figure, and parameter generation circuits that generate values for the various communication architecture protocol parameters during system execution. Next, the role of these circuits are described briefly.

Partition detector: a communication partition is described as a subset of the communication transactions generated by the component during system execution. For each component, the present algorithm identifies a number of partitions, and the conditions that must be satisfied by a communication transaction for it to be classified under each partition. These conditions are incorporated into the partition detector circuit. The partition detector circuit monitors and analyzes the following information generated by the component:

Tracer tokens generated by the component to indicate that it is executing specific operations. The component is enhanced to generate these tokens purely for the purpose of the CAT.

The communication transaction initiation requests that are generated by the component.

Any other application-specific properties of the communication data being generated by the component (e.g., fields in the data which indicate its relative importance).

The partition detector uses specific sequences of tracer tokens and communication requests to identify the beginning and end of a sequence of consecutive communication transactions that belong to a partition. For example, the regular expressions $t1.x^*.C^4$ and $t1.x^*.C^8$ may be used to delineate communication events that belong to partition $CP_1$. This means that the fourth to seventh communication transactions that are generated following token t1 will be classified under partition $CP_1$.

In Section IV.C.2 general techniques to automatically compute the start and end conditions for each partition are disclosed.

Parameter generation circuits: These circuits compute values for communication protocol parameters (e.g. priorities, DMA/block sizes, etc.) based on the partition ID generated by the partition detector circuit, and other application-specific data properties specified by the system designer. The values of these parameters are sent to the arbiters and controllers in the communication architecture, resulting in a change in the characteristics of the communication architecture. Automatic techniques to design the parameter generation circuits are presented in Section IV.C.2.

The functioning of a CAT-based communication architecture is illustrated using symbolic waveforms in FIG. 9. The first two waveforms represent tracer tokens generated by the component. The next two waveforms represent the communication transactions generated by the component, and the state of the partition detector circuit, respectively. The state of the partition detector circuit changes first from S0 to S1, and later from S1 to S2, in reaction to the tracer tokens generated by the component. The fourth communication transaction generated by the component after the partition detector reaches state S2 causes it to transition into state S3. All communication transactions that occur when the partition detector FSM is in state S3 are classified as belonging to partition $CP_1$. The fifth waveform shows the output of the priority generation circuit. The priority generation circuit assigns a priority level of 4 to all communication transactions that belong to partition $CP_1$. This increase in priority leads to a decrease in the delay associated with the communication transactions that belong to partition $CP_1$, as shown in the last waveform of FIG. 9.

An embodiment of the overall algorithm for designing CAT-based communication architectures is shown in FIG. 10. In step 1, performance analysis is performed on the partitioned/mapped system description in order to derive the information and statistics used in the later steps. In the present work, the performance analysis technique presented in Lahiri et al, which is comparable in accuracy to complete system simulation, while being much more efficient to employ in an iterative manner. For more details, see K. Lahiri, A. Raghunathan and S. Dey, "Fast Performance Analysis of Bus Based System-on-Chip Communication Architectures," in *Proc. Int. Conf. Computer-Aided Design*, November 1999. The output of this analysis is a communication analysis graph, (CAG) which is a highly compact representation of the system's execution under the given input traces. The vertices in the graph represent clusters of computations and abstract communications performed by the various components during the system execution. The edges in the graph represent the inter-dependencies between the various computations and communications. Note that since the communication analysis graph is effectively unrolled in time, it is acyclic, and may contain several distinct instances of a single computation operation or communication from the system specification. The communication analysis graph is constructed by extracting necessary and sufficient information from a detailed system execution trace. See K. Lahiri, A. Raghunathan and S. Dey, "Fast Performance Analysis of Bus Based System-on-Chip Communication Architectures," in *Proc. Int. Conf. Computer-Aided Design*, November 1999. The CAG can be easily analyzed to determine various performance statistics such as system critical path, average processing time, number of missed deadlines, etc.

In step 2, the communication vertices are grouped in the communication analysis graph into a number of partitions. The main rationale behind this partitioning is that each of the partitions may have distinct communication requirements, and hence may potentially require a different set of values to be assigned to the parameters of the communication protocol (e.g., priorities, DMA sizes, etc.) in order to optimize system performance. Note that in the extreme case, each communication vertex in the communication analysis graph can be assigned to a distinct partition. However, this has two disadvantages: (i) the area and delay overhead incurred in the CAT may become prohibitive, and (ii) the use of very small partitions can lead to CAT hardware that is highly sensitive to variations in input traces. The present disclosure proposes a novel metric, called sensitivity, which is used to group communication instances (vertices) into partitions in Section IV.C.2.a. Techniques that enable the designer to select an optimal granularity for the partitions are also presented.

Step 3 evaluates various statistics for each communication partition, based on which, step 4 determines an assignment of communication architecture parameter values for each partition. The details of these steps are presented in Section IV.C.2.b. The output of step 4 is a set of candidate protocols for the system communication architecture.

Step 5 re-evaluates the system performance for the optimized protocols derived in Step 4. If a performance improvement results, steps 1 to 5 are repeated until no further performance improvement is obtained.

Step 6 deals with synthesis of hardware (CATs) to implement the optimized protocols that were determined in step 4. It is critical to consider the hardware implementation complexity and overheads in order to fully exploit the potential of CAT-based communication architectures. In Section IV.C.2.c, the problem of generating the partition detector and parameter generation circuits is formulated as a problem of generating a minimum-complexity function to fit a set of data points, and outline how it can be efficiently solved using well-known techniques from regression theory. See G. A. F. Seber, C. J. Wild., *Non-linear Regression*. Wiley, New York, 1989.

IV.C.2. Algorithm and Methodology: Details

In this section the steps outlined above are discussed in more detail. Techniques to obtain partitions of the communication event instances are presented. How to select an optimal set of protocol parameter values and how to synthesize CAT hardware for classifying communication event instances into partitions is discussed.

a) Profiling and Partitioning Communication Event Instances

In this section, the partitioning step of the present methodology (step 2 of FIG. 10) is discussed in detail. The objective of the partitioning step is to identify and cluster into a single partition, a set of communication event instances that can be treated by the communication protocol in a uniform manner. For instance, the protocol could define all members of a given partition to have the same priority for accessing a shared bus.

The communication analysis graph generated by step 1 of our algorithm contains sufficient information to mea-sure the performance of the system as a function of the delays of its communication events. In step 2, an analysis of the CAG is performed to measure the impact of individual communication instance delays on the system performance. Instances which have a similar impact on the system performance are grouped into the same partition. The performance impact of an instance is measured by a parameter called sensitivity that captures the change in system performance when the communication delay of the instance changes. The following example illustrates the partitioning procedure.

FIG. 11 shows a section of a CAG generated from a representative execution of an example system. Shaded vertices $c_1$ through $c_4$ represent instances of communication events. Vertices $z_1$ and $z_2$ represent the final outputs of the system. The objective function to be minimized is the quantity $t(z_1)+t(z_2)$ where $t(v)$ is the finish time of a vertex $v$ in the CAG.

To measure the sensitivity of the system performance to communication instance $c_1$, the existing delay of $c_1$ is perturbed by a value $\Delta$, and a traversal of the transitive fanout of $c_1$ in the CAG is used to re-compute the start and finish times of the affected vertices. The updated finish times of the vertices are used to calculate the change in the system performance metric. In this example, perturbing the delay of $c_1$ by 10 units delays the finish of both $z_1$ and $z_2$ by 10 units each, while perturbing the delay of $c_2$ delays $z_1$ alone. Similarly, delaying $c_3$ delays the finish time of $z_2$ by 10 units. Since $c_4$ doesn't lie on a critical path, perturbing it has no effect on system performance.

Using the procedure described above, a sensitivity $s(c_i)$ for each communication instance $c_i$, is calculated which measures the change in the value of the objective function O after perturbing the delay of $c_i$ by $\Delta$. Next, communication instances that have similar sensitivity values are assigned to the same partition. In this example, based on the $s(c_i)$ values shown in FIG. 11, $c_1$ is assigned to $CP_1$, $c_2$ and $C_3$ are assigned to $CP_2$, and $c_3$ is assigned to $CP_3$. As mentioned before, events in the same partition are treated similarly by the CAT.

b) Modifying Protocol Parameters

In this section steps 3 and 4 of the disclosed methodology are described, i.e., how to examine each partition and then assign optimized protocol parameter values to them. While the discussion is confined to determining the priority that should be assigned to each partition, it could be extended to include other protocol parameters such as whether burst mode should be supported or not, and if so what the correct DMA size should be.

The sensitivity of a partition indicates the impact its events have on the performance of the system. However assigning priorities based on the sensitivity of a partition alone may not lead to the best assignment. This is because sensitivity does not capture the indirect effects of a communication event or set of events on the delays of other concurrent communication events (such effects occur due to the presence of shared channels/buses in the communication architecture). This is accounted for by deriving a metric that penalizes partitions which are likely to negatively impact the delays of communication events in other partitions. In order to obtain this information, the CAG is analyzed and evaluated, for each pair of partitions $CP_i$, $CP_j$, the amount of time for which communication events that belong to $CP_i$ are delayed due to events from $CP_j$. Table 1 shows example data for a system with three partitions. Column 2 gives the sensitivity of each partition. Columns 3, 4 and 5 gives the total time ($w_{ij}$) that instances in partition $CP_1$, $CP_2$ and $CP_3$ wait for instances in each of the other partitions. For example, instances in $CP_1$ induce a total wait of 100 cycles for instances of $CP_2$ to finish. Column 6 gives the sum of columns 3, 4 and 5 to indicate the total waiting time ($W_i$) events in partition $CP_i$ have introduced in other partitions, e.g., $CP_2$ induces a total wait of only 7 cycles on $CP_1$ and $CP_3$.

TABLE 1

Statistics of the Partition

| Partition | Sensitivity $s(c_i)$ | $w_u$ (clock cycles) | $w_a$ (clock cycles) | $w_a$ (clock cycles) | $W_i$ (clock cycles) | Priority mapping |
|---|---|---|---|---|---|---|
| $CP_1$ | 100 | 0 | 100 | 3 | 103 | 17.18 => 2 |
| $CP_2$ | 85 | 4 | 0 | 3 | 7 | 23.57 => 1 |
| $CP_3$ | 10 | 0 | 7 | 0 | 7 | −75.0 => 3 |

Finding the ideal way to combine these statistical parameters into a formula that produces the optimum priority assignment is a hard optimization problem to solve. Instead, a heuristic calculation that boosts a partition's priority in a way proportional to its sensitivity, but penalizes it for the waiting times $w_{ij}$ it introduces in other partitions is used. Using the notation of Table 1, the priority of a partition $CP_i$ is defined as:

$$Pi = V\left(s(i) - \sum_{j=1}^{n} \frac{s(j)wij}{Wi}\right)$$

In this formula, the first term accounts for the sensitivity of the partition $CP_i$, while the summation penalizes the partition for holding up others. The function $V(x)$ maps $x$, the result of the summation to a small integer number $P_i$, while preserving the relative order, i.e., if $x_i > x_j$, $P_i > P_j$. Column 7 of Table 1 shows this mapping for the given values.

c) Synthesis of an Optimal Communication Protocol

In this section how to synthesize hardware to classify each instance of a communication event generated by component into a partition is described. The classification is based on the current state of a component which is derived from a short history of its control flow.

Procedure for FSM synthesis is explained with an example. FIG. 12 shows an extract of a CAG after the sensitivity-based partitioning step has been performed. For simplicity, only communication vertices are shown in the figure. In the execution trace of component $Comp_1$, all highlighted vertices belong to partition $CP_1$. In the CAT hardware synthesis step, the goal is to generate a Boolean formula which evaluates to 1 when a vertex belongs to $CP_1$ and to 0 at other times. In order to obtain a low-complexity hardware implementation, the only requirement is that the Boolean formula approximate the chosen partitioning scheme as closely as possible. The next three waveforms in FIG. 12 show three cases where different events, $t_1$, $t_2$, $t_3$, have been chosen to act as tracers for component $C_1$. For each choice of tracer, a distance is calculated for each communication instance, given by the number of communication instances separating it from the previous instance of a tracer token.

In order to perform partition assignment, CAT hardware is designed to detect a tracer, count and ignore x number of communication instances, and then start assigning the next p number of instances to a particular partition. For example, for Formula$_1$, $t_1$ is the tracer, x=4, and p=3. FIG. 12 shows the actual classification of communication instances that results from each of the three formulae. FIG. 13 shows the prediction accuracy of each of the formulae under test. It turns out that Formula$_1$ performs the best, predicting with a probability of 0.9 whether or not a given instance belongs to Partition$_1$.

Each formula involves a tracer as a starting point and a count on the number of occurrences of communication events and hence can be expressed as a regular expression. Consequently, it can be directly translated to hardware implementation as a Finite State machine (FSM). FIG. 14 shows the FSM that implements Formula$_1$.

In general, choosing the appropriate tracer tokens and appropriate values for x and p may not be a trivial task. The problem is formulated in terms of a well-known problem from regression theory, and use known statistical techniques to solve it.

A data set is constructed from the CAG for each examined tracer consisting of distances $d_1, d2, \ldots d_n$, and a 0 or 1 value for each $d_i$ (derived from the partitioned CAG) indicating whether or not the communication instance at distance $d_i$ from the tracer token belongs to a partition $CP_i$. The regression function f is defined as follows:

$$f(d, \theta) = \begin{cases} 1 : \theta_1 < d < \theta_2 \\ 0 : \text{elsewhere} \end{cases}$$

When f is 1, it indicates the instance at a distance d belongs to $CP_i$. An assignment $\theta = \{\theta_1, \theta_2\}$ (where $\theta_1 = x$ and $\theta_2 = x+p$) is required that causes the least square error $$\sum_{i=1}^{n} |y - f(d, \theta)|^2,$$

where y is the value from the data set, and $f(d, \theta)$ is the prediction. Since the regression function is non-linear in $\theta$, no universal technique is known to compute an explicit solution. However, several heuristics and iterative procedures exist which may be used. See G. A. F. Seber, C. J. Wild., *Non-linear Regression*. Wiley, New York, 1989.

Note that, the regression function could in general be constructed to utilize additional designer-specified parameters, such as partial internal state from the component, and properties of the data being processed by the system (e.g., a QoS stamp or a deadline value).

IV. D. Experimental Results

Results of the application of the present techniques to several example systems, including a TCP/IP network interface card system, and the packet forwarding unit of an output-queued ATM switch is presented. Performance results based on system-level co-simulation for each example are presented.

The first example is the TCP system described in the Background section in relation to Example 1. The second example is a packet forwarding unit of an output queued ATM switch (shown in FIG. 15). The system consists of 4 output ports, each with a dedicated small local memory that stores queued packet addresses. The arriving packet bits are written to a dual-ported shared memory. The starting address of each packet is written to an appropriate output queue by a scheduler. Each port polls its queue to detect presence of a packet. If it is non-empty, the port issues a dequeue signal to its local memory, extracts the relevant packet from the dual-ported shared memory and sends it onto its output link.

The next example, SYS, is a four component system (shown in FIG. 16) where each component issues independent concurrent requests for access to a shared memory. FIG. 17 shows BRDG, another system consisting of four components, two memories and two buses connected by a bridge. The components themselves are each connected to one of the buses, but can make requests to the local bus arbiter for access to the remote memory via the bridge. Also, the components synchronize with each other via dedicated links.

Table 2 demonstrates the performance benefits of using CAT-based communication architectures over a static priority based communication protocol. See *On-Chip Bus Development Working Group Specification I Version* 1.1.0. VSI Alliance, August 1998. Each row in the table represents one of the example systems described earlier. For each system, column 2 defines a performance metric. In the case of TCP, SYS and ATM these are derived from a set of deadlines that are associated with each piece of data that passes through the system. The objective in each case is to minimize the number of missed deadlines for these examples. In the case of BRDG, each data transaction is assigned a weight. The performance of the system is expressed as a weighted mean of the processing time of each transaction. The objective in this case is to minimize this weighted average processing time. The static communication protocol consists of a fixed DMA size for each communication request and a static priority based bus arbitration scheme. For these examples, the CATs scheme for identifying partitions and assigning priorities and DMA sizes makes use of user specified information such as the weights on each requests and deadlines as described in Section 3 to provide for a more flexible communication protocol.

For each system, column 4 reports performance results obtained using a static communication protocol, while

TABLE 2

Performance of systems using CAT based architectures

| Example System | Performance metric | Input Trace Information | Static Protocol | CATs based architecture | Performance improvement |
|---|---|---|---|---|---|
| TCP/IP | missed deadlines | 20 packets | 10 | 0 | — |
| SYS | missed deadlines | 573 transactions | 413 | 17 | 24.3 |
| ATM | missed deadlines | 169 packets | 40 | 16 | 2.5 |
| BRDG | avg. execution time (cycles) | 10,000 clock cycles | 304.72 | 254.1 | 1.2 | column 5 reports results generated by simulating a CATs based architecture. Speed-ups are reported in column 6. The results indicate that significant benefits in performance can be obtained by using a CATs based architecture over a protocol using fixed parameter values. In the case of TCP/IP, the number of missed deadlines was reduced to zero, while in the case of SYS, a 24X performance improvement (reduction in the number of missed deadlines) was observed.

The design of an efficient CAT-based communication architecture depends on the selection of a good representative trace when performing the various steps of the algorithm of FIG. 10. However, the present algorithms attempt to generate communication architectures that are not specific to the input traces used to design them, but display improved performance over a wide range of communication traces. In order to analyze the input trace sensitivity of the performance improvements obtained through CAT-based communication architectures, the following additional experiment was performed. For the SYS example, the system was simulated with CAT-based and conventional communication architectures for three different

TABLE 3

Immunity of CAT based architectures to variation in inputs

| Inputs to the SYS example | Input Trace Information | Static Protocol | CATs based architecture | Performance improvement |
|---|---|---|---|---|
| Trace 1 | 848 transactions | 318 | 161 | 1.98 |
| Trace 2 | 573 transactions | 413 | 17 | 24.3 |
| Trace 3 | 1070 transactions | 316 | 38 | 8.37 | input traces that had widely varying characteristics. Table 3 presents the results of our experiments. The parameters of the input traces were chosen at random to simulate run-time unpredictability. In all the cases, the system with a CAT-based communication architecture demonstrated a consistent and significant improvement over the system based on a conventional communication architecture. This demonstrates that the performance of CAT-based architectures are not overly sensitive to variations in the input stimuli, since they are capable of adapting to the changing needs of the system.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of designing a communication architecture comprising:
 a) receiving a partitioned system, communication architecture topology, input traces and performance matrices;
 b) analyzing and creating communication analysis graph (CAG);
 c) grouping communication instances to create partitions (CP) clusters using the following sub-steps;
  (c)(i) analyzing the CAG to measure impact of individual communication instance delays on system performance;
  (c)(ii) measuring performance impact of an instance using sensitivity; and
  (c)(iii) grouping instances having a similar impact on system performance into a same partition
 d) evaluating cluster statistics related to the partitions and assigning parameter values to the partitions to form a new system with new communication architecture;
 e) reanalyzing the new system and recomputing performance metrics;
 f) if performance is not improved then returning to step c; and
 g) if performance is improved then synthesizing CATs to realize optimized protocols.

2. The method of claim 1 wherein said sensitivity of the system performance to a communication instance is measured as follows:
 perturbing an existing delay of the communication instance by a predetermined value;
 traversing a transition fanout of the communication instance in the CAG;
 recomputing a start and finish time of affected vertices; and
 calculating changes in the system performance using recomputed finish times.

3. The method of claim 1 wherein step d is accomplished by deriving a metric that penalizes a partition having a negative impact on delays of communication events in other partitions.

4. The method of claim 3 wherein said metric is calculated as follows:
 analyzing the CAG and evaluating for each partition pair $CP_i$ $CP_j$ an amount of time for which communication events that belong to $CP_i$ are delayed due to events from $CP_j$ to form delay statistics, wherein i and j are positive integer values; and
 combining the delay statistics into a formula that produces an optimum parameter value assignment.

5. The method of claim 4 wherein said parameter value assignment is done using heuristics.

6. The method of claim 4 wherein said parameter value is a priority.

7. The method of claim 4 wherein said parameter value is DMA block size.

8. The method of claim 4 wherein said parameter value assignment takes into account hardware complexity of implementing the parameter.

* * * * *